(12) United States Patent
Manna et al.

(10) Patent No.: US 10,643,841 B2
(45) Date of Patent: May 5, 2020

(54) SURFACE MODIFICATION TO IMPROVE AMORPHOUS SILICON GAPFILL

(71) Applicant: Applied Materials, Inc., Santa Clara, CA (US)

(72) Inventors: Pramit Manna, Santa Clara, CA (US); Shishi Jiang, Santa Clara, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/679,899

(22) Filed: Nov. 11, 2019

(65) Prior Publication Data

US 2020/0075329 A1 Mar. 5, 2020

Related U.S. Application Data

(62) Division of application No. 15/936,740, filed on Mar. 27, 2018, now Pat. No. 10,483,102.

(60) Provisional application No. 62/482,736, filed on Apr. 7, 2017.

(51) Int. Cl.
*H01L 21/00* (2006.01)
*H01L 21/02* (2006.01)
(Continued)

(52) U.S. Cl.
CPC ...... *H01L 21/02532* (2013.01); *C23C 16/045* (2013.01); *C23C 16/24* (2013.01); *C23C 16/505* (2013.01); *H01L 21/0262* (2013.01); *H01L 21/02488* (2013.01); *H01L 21/02592* (2013.01); *H01L 21/02658* (2013.01);
(Continued)

(58) Field of Classification Search
CPC ........... H01L 21/02532; H01L 21/0243; H01L 21/02488; H01L 21/02592; C23C 16/0245; C23C 16/045
See application file for complete search history.

(56) References Cited

U.S. PATENT DOCUMENTS 7,825,040 B1 * 11/2010 Fukazawa ............. C23C 16/401
257/E21.191
7,947,551 B1 5/2011 Syue et al.
(Continued)

*Primary Examiner* — Nicholas J Tobergte
(74) *Attorney, Agent, or Firm* — Patterson + Sheridan LLP

(57) ABSTRACT

Methods for gapfilling semiconductor device features, such as high aspect ratio trenches, with amorphous silicon (a-Si) film that involves pretreating the surface of the substrate to modify the underlying hydroxy-terminated silicon (Si—OH) or hydrogen-terminated silicon (Si—H) surface to oxynitride-terminated silicon (Si—ON) or nitride-terminated silicon (Si—N) and enhance the subsequent a-Si deposition are provided. First, a substrate having features formed in a first surface of the substrate is provided. The surface of the substrate is then pretreated to enhance the surface of the substrate for the flowable deposition of amorphous silicon that follows. A flowable deposition process is then performed to deposit a flowable silicon layer over the surface of the substrate. Methods described herein generally improve overall etch selectivity by the conformal silicon deposition and the flowable silicon deposition process to realize seam-free gapfilling between features with high quality amorphous silicon film.

20 Claims, 3 Drawing Sheets

(51) Int. Cl.
*H01L 21/762* (2006.01)
*C23C 16/04* (2006.01)
*C23C 16/505* (2006.01)
*C23C 16/24* (2006.01)
*C23C 16/02* (2006.01)

(52) U.S. Cl.
CPC .... *H01L 21/76224* (2013.01); *C23C 16/0245* (2013.01); *H01L 21/0243* (2013.01); *H01L 21/02664* (2013.01)

(56) References Cited

U.S. PATENT DOCUMENTS

| | | | |
|---|---|---|---|
| 7,999,355 B2 * | 8/2011 | Weigel | C23C 18/122 257/632 |
| 8,557,712 B1 | 10/2013 | Antonelli et al. | |
| 8,592,328 B2 * | 11/2013 | Hausmann | C23C 16/45542 438/792 |
| 8,685,867 B1 * | 4/2014 | Danek | H01L 21/76801 257/E21.001 |
| 9,330,939 B2 | 5/2016 | Zope et al. | |
| 9,362,133 B2 * | 6/2016 | Shamma | H01L 21/02115 |
| 2002/0177270 A1 | 11/2002 | Beyer et al. | |
| 2005/0260347 A1 * | 11/2005 | Narwankar | C23C 16/401 427/248.1 |
| 2006/0045988 A1 | 3/2006 | Guo et al. | |
| 2011/0256726 A1 * | 10/2011 | LaVoie | C23C 16/045 438/702 |
| 2012/0094468 A1 * | 4/2012 | Bhatia | H01L 21/02126 438/437 |
| 2012/0149213 A1 * | 6/2012 | Nittala | C23C 16/02 438/783 |
| 2014/0193979 A1 | 7/2014 | Or et al. | |
| 2017/0243734 A1 * | 8/2017 | Ishikawa | C23C 16/045 |

* cited by examiner

SURFACE MODIFICATION TO IMPROVE AMORPHOUS SILICON GAPFILL

CROSS-REFERENCE TO RELATED APPLICATIONS

This application is a divisional of co-pending U.S. patent application Ser. No. 15/936,740, filed Mar. 27, 2018, which claims benefit of U.S. provisional patent application Ser. No. 62/482,736, filed Apr. 7, 2017, each of which is herein incorporated by reference.

BACKGROUND

Field

Examples of the present disclosure generally relate to semiconductor manufacturing processes, more particularly, to methods for gapfilling high aspect ratio trenches of semiconductor devices with amorphous silicon film, and devices formed by the methods.

Description of the Related Art

For many semiconductor device manufacturing processes, there is a need to fill narrow trenches having high aspect ratios greater than, for example, 10:1, with no voiding. One example of such a process is shallow trench isolation (STI) in which the film needs to be of high quality and have very low leakage throughout the trench. As the dimensions of semiconductor device structures continue to decrease and the aspect ratios increase, post-curing processes become increasingly difficult and result in films with varying composition throughout the filled trench.

Conventionally, amorphous silicon (a-Si) has been used in semiconductor manufacturing processes since a-Si generally provides good etch selectivity with respect to other films, such as silicon oxide (SiO) and amorphous carbon (a-C). The conventional a-Si deposition methods, such as plasma-enhanced chemical vapor deposition (PECVD) and conformal deposition, however, cannot be used to gapfill high aspect ratio trenches because a seam forms in the high aspect ratio trenches. A seam may result in the formation of one or more gaps in the trench between the sidewalls, which may be further opened up during post-curing processes. Such seams and gaps ultimately cause decreased throughput or even semiconductor device failure. Additionally, PECVD of a-Si may also result in voiding at the bottom of the trench, which may also result in semiconductor device failure.

Additionally, the success of gapfilling high aspect ratio trenches with a-Si depends on the nature of the underlying surface. For example, when the underlying surface is hydroxy-terminated silicon (Si—OH), or hydrogen-terminated silicon (Si—H), microporosity and microvoiding has been observed.

Therefore, there is a need for methods for gapfilling high aspect ratio trenches of semiconductor devices that can provide seam-free and void-free film growth.

SUMMARY

Methods are provided for gapfilling semiconductor device features, such as high aspect ratio trenches, with amorphous silicon (a-Si) film that involve pretreating the surface of the substrate. The pretreatment modifies the underlying hydroxy-terminated silicon (Si—OH) or hydrogen-terminated silicon (Si—H) surface to oxynitride-terminated silicon (Si—ON) or nitride-terminated silicon (Si—N), and enhances the subsequent a-Si deposition. First, a substrate having features formed in a first surface of the substrate is positioned in a processing chamber. The surface of the substrate is then pretreated to enhance the surface of the substrate for the flowable deposition of amorphous silicon that follows. A flowable deposition process is then performed to deposit a flowable silicon layer over the surface of the substrate. Methods described herein generally improve overall etch selectivity by the conformal silicon deposition and the flowable silicon deposition process to realize seam-free gapfilling between features with high quality amorphous silicon film.

In one example, a method for manufacturing a semiconductor device is disclosed. The method includes positioning a substrate having at least one feature formed in a surface of the substrate in a processing chamber, the at least one feature having sidewalls and a bottom surface, exposing the at least one feature formed in the surface of the substrate to a pretreatment process, and filling the at least one feature with a flowable silicon film. The pretreatment process includes exposing the surface of the substrate to an inert gas and exposing the surface of the substrate to reactive plasma.

In another example, a method for manufacturing a semiconductor device is disclosed. The method includes positioning a substrate having at least one feature formed in a surface of the substrate in a processing chamber, the at least one feature having sidewalls and a bottom surface, exposing the at least one feature formed in the surface of the substrate to a pretreatment process, and filling the at least one feature with a flowable silicon film. The pretreatment process includes exposing the surface of the substrate to one or more reactive radicals.

In yet another example, a semiconductor device is disclosed. The semiconductor device includes a substrate having at least one feature formed in a surface of the substrate, the at least one feature having sidewalls and a bottom surface, an oxynitride-terminated silicon layer disposed over the surface of the substrate and the sidewalls and the bottom surface of the at least one feature, and a flowable silicon film disposed over the oxynitride-terminated silicon layer.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of scope, for the disclosure may admit to other equally effective examples.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Methods are provided for gapfilling semiconductor device features, such as high aspect ratio trenches, with amorphous silicon (a-Si) film that involves pretreating the surface of the substrate to modify the underlying hydroxy-terminated silicon (Si—OH) or hydrogen-terminated silicon (Si—H) surface to oxynitride-terminated silicon (Si—ON) or nitride-terminated silicon (Si—N) and enhance the subsequent a-Si deposition. First, a substrate having features formed in a first surface of the substrate is positioned in a processing chamber. The surface of the substrate is then pretreated to enhance the surface of the substrate for the flowable deposition of amorphous silicon that follows. A flowable deposition process is then performed to deposit a flowable silicon layer over the surface of the substrate. Methods described herein generally improve overall etch selectivity by the conformal silicon deposition and the flowable silicon deposition process to realize seam-free gapfilling between features with high quality amorphous silicon film.

Figure 1:
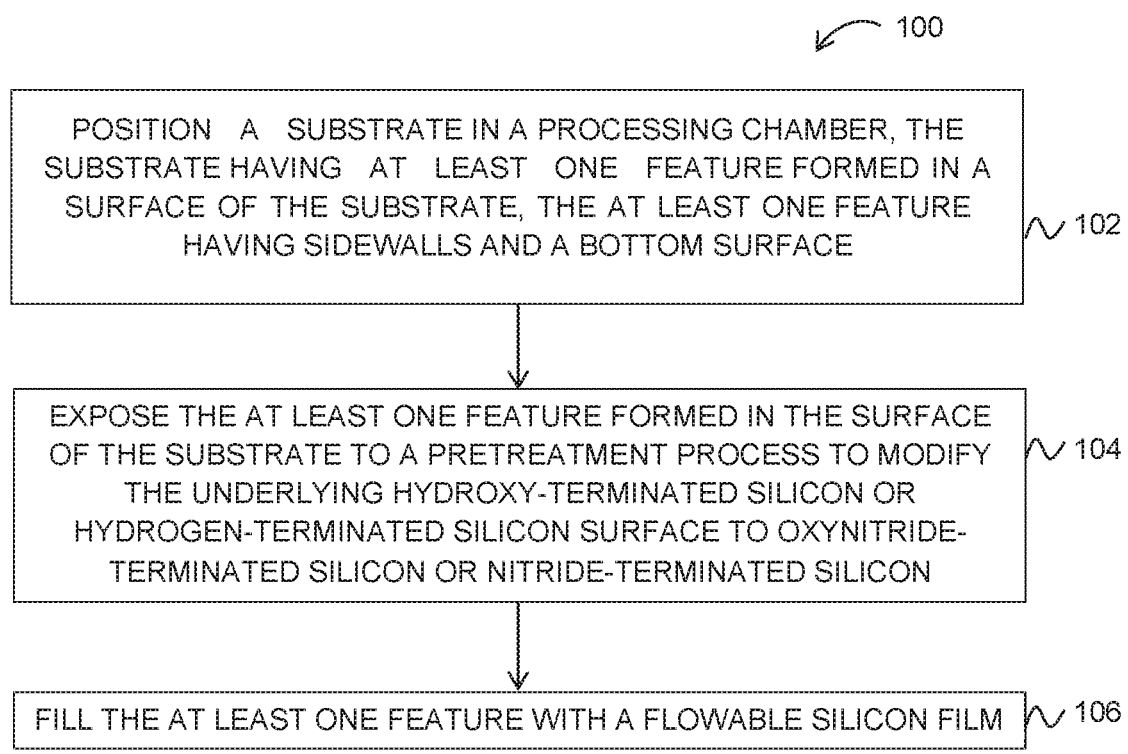
FIG. 1 is a flow diagram summarizing a method according to one example described herein.
Figure 2A:
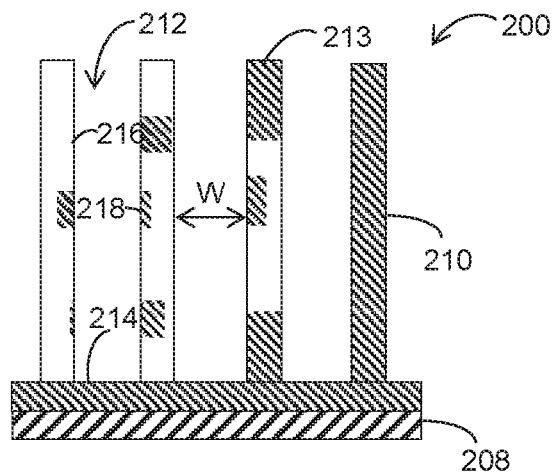
FIGS. 2A-2C depict stages of fabrication of a semiconductor device in accordance with the method of FIG. 1.
Figure 2B:
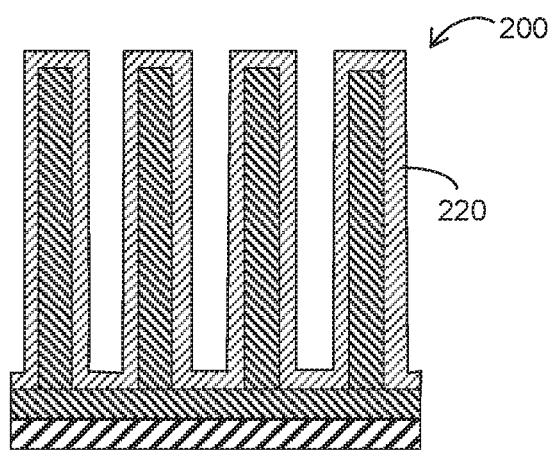
Figure 2C:
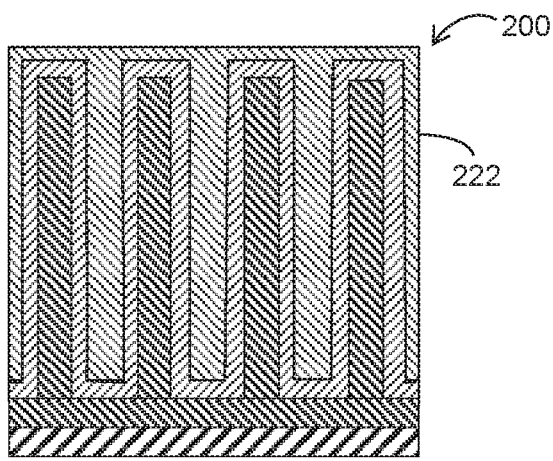

FIG. 1 is a flow diagram summarizing a method 100 for gapfilling high aspect ratio trenches of a semiconductor device with amorphous silicon film. FIGS. 2A-2C depict stages of fabrication of a semiconductor device 200 in accordance with the method 100 of FIG. 1. The method 100 is described below in accordance with stages of gapfilling high aspect ratio trenches of a semiconductor device 200 with amorphous silicon film as illustrated in FIGS. 2A-2C. The description that follows will refer to high aspect ratio trenches formed on a substrate, such as a silicon substrate; however, methods described herein are also applicable to gapfilling between other semiconductor device features. Features generally have any suitable shape, including, but not limited to, trenches and cylindrical vias. Generally, "feature" means any intentional surface irregularity. Suitable examples of features include, but are not limited to, trenches which have a top, two sidewalls and a bottom, peaks which have a top and two sidewalls. Features can have any suitable aspect ratio, or ratio of the depth of the feature to the width of the feature. In some examples, the aspect ratio is greater than or equal to about 5:1, 10:1, 15:1, 20:1, 25:1, 30:1, 35:1, or 40:1.

The method 100 begins at operation 102 in which a substrate 208 with a plurality of features 212 (shown as trenches) formed in a silicon containing layer 210 of the substrate 208, as shown in FIG. 2A, is positioned within a processing chamber. The substrate 208 may be any suitable size and material, for example, a 300 mm substrate. The features 212 generally extend from a surface of the substrate 213 to a depth (D) to a bottom surface 214. The features 212 generally include a first sidewall 216 and a second sidewall 218 that define a width (W) of the feature 212. As shown in FIG. 2A, the substrate 208 has a plurality of features 212; however, it is contemplated that the substrate 208 can have one or more than one feature 212. As discussed above, the silicon containing layer 210 of the surface of the substrate 208 is generally hydroxy or hydrogen-terminated, which often results in microporosity and microvoiding issues.

At operation 104, prior to deposition of a flowable silicon film on the substrate 208, but after the substrate 208 having features 212 has been positioned in a processing chamber, a pretreatment process may be performed to pretreat the surface of the substrate 213, thus forming a pretreated surface layer 220 on the surface of the substrate 213, the first and second sidewalls 216, 218, and bottom surface 214, as shown in FIG. 2B. Operation 104 generally modifies the underlying hydroxy-terminated silicon (Si—OH) or hydrogen-terminated silicon (Si—H) surface of the substrate to oxynitride-terminated silicon (Si—ON) or nitride-terminated silicon (Si—N) to enhance the subsequent a-Si deposition. As described below, various pretreatment processes may be used.

In one example, the pretreatment process of operation 104 generally includes treating the surface of the substrate 213 and features 212 formed therein with a pretreatment gas mixture. The pretreatment gas mixture generally includes at least a reactive gas, including but not limited to at least one of a hydrogen gas ($H_2$), ammonia ($NH_3$), oxygen gas ($O_2$), and nitrous oxide ($N_2O$). An inert gas, including but not limited to at least one of helium (He), argon (Ar), and the like, is generally also supplied into the pretreatment gas mixture. By exposing the surface of the substrate 213 to the inert gas and exposing the surface of the substrate to reactive plasma, the surface of the substrate 213 is modified to contain a oxynitride or nitrogen-terminated silicon pretreated surface layer 220, which causes enhanced subsequent flowable amorphous silicon deposition, and thus, enhanced and seam-free gapfilling. The pretreatment gas mixture is generally supplied by a remote plasma source (RPS), such as a capacitively coupled plasma (CCP) source, or any other suitable source.

In another example, the pretreatment process of operation 104 generally includes treating the surface of the substrate 213 and features 212 formed therein with reactive radicals. The reactive radicals may be radical species from a plasma from ions have been filtered out. The reactive radicals generally include, but are not limited to, one or more of $NH_3$, $H_2$, $O_2$, $N_2O$, and $N_2$. The reactive radicals are generally supplied by an RPS, such as a CCP source, or any other suitable source. By exposing the surface of the substrate 213 to reactive radicals, the surface of the substrate 213 is modified to contain an oxynitride or nitrogen-terminated silicon pretreated surface layer 220, which causes enhanced subsequent flowable amorphous silicon deposition, and thus, enhanced and seam-free gapfilling.

During the pretreatment process of operation 104, several processing parameters are generally regulated to control the pretreatment process. For example, when a CCP source is used, the frequency is 13.6 megahertz (MHz) or 2 MHz. The pretreatment process pressure in the process chamber is generally between about 1 Torr (T) and about 50 T, such as 5 Torr to about 40 Torr, for example about 10 Torr to about 30 Torr. An RF power between about 10 Watts (W) and about 1000W is generally applied to maintain plasma in the pretreatment gas mixture. A temperature of the pretreatment process is generally between about 0 degrees Celsius (° C.) and about 400° C.

In yet another example, the pretreatment process of operation 104 generally includes treating the surface of the substrate 213 and features 212 formed therein with chemical passivation of the Si—OH or Si—H bonds using at least one of aminosilanes and chlorosilanes. Examples of aminosilanes include, but are not limited to, silanamine ($H_5NSi$) and (3-Aminopropyl)triethoxysilane (APTES). Examples of chlorosilanes include, but are not limited to, $ClH_3Si$. By performing chemical passivation on the surface of the substrate 213 using at least one of aminosilanes and chlorosilanes, the surface of the substrate 213 is modified to contain an oxynitride or nitrogen-terminated silicon pretreated surface layer 220, which causes enhanced subsequent flowable amorphous silicon deposition, and thus, enhanced and seam-free gapfilling.

In even further examples, the pretreatment process of operation 104 generally includes any combination of the aforementioned pretreatment processes.

At operation 106, the feature 212 is filled with a flowable silicon film 222, as shown in FIG. 2C. In one example, the flowable silicon film 222 is deposited on and in contact with the pretreated surface layer 220. The flowable silicon film 222 generally comprises amorphous silicon having hydrogen (H) concentration of greater than about 30%. The flowable silicon film 222 fills the remaining space in the features 212 so that substantially no seam is formed in the features 212. The flowable silicon film 222 can be deposited by any suitable process, such as the process described in U.S. patent application Ser. No. 62/354,743, which is herein incorporated by reference in its entirety, and is discussed below.

In one example, the flowable silicon film 222 is deposited by a PECVD process. The PECVD process generally begins by exposing the surface of the substrate 213 to a reactive gas, which generally includes one or more species. For example, the reactive gas generally includes a second precursor and a plasma gas, which is used as a diluent or carrier gas for the first precursor. The second precursor generally includes one or more of silane ($SiH_4$), disilane ($Si_2H_6$), trisilane ($Si_3H_8$), and tetrasilane ($Si_4H_{10}$). The plasma gas generally includes one or more of helium (He), argon (Ar), hydrogen gas ($H_2$), krypton (Kr), nitrogen gas ($N_2$), oxygen gas ($O_2$), ozone ($O_3$), or ammonia ($NH_3$).

The plasma can be generated or ignited within a processing chamber (e.g., a direct plasma) or can be generated outside of a processing chamber and flowed into the processing chamber (e.g., a remote plasma). The radiofrequency (RF) power used for igniting the plasma is generally between about 10 watts (W) and about 200W. During the PECVD process for depositing the flowable silicon film, the temperature in the processing environment is generally between about −100° C. and about 50° C., and the pressure is generally between about 1 Torr and about 10 Torr.

The flowable silicon film 222 is generally of a suitable thickness to fill the remaining space in the features 212. In the example discussed above in which the features 212 have a width (W) of about 20 nm, then the flowable silicon film 222 generally has a thickness of about 4 nm to provide a seam-free gapfill in the features 212.

After operation 106, further processing operations may be performed, such as curing and or annealing operations, to increase the density o the flowable silicon film 222. Additionally, it is contemplated that operations, such as precleaning, may be performed prior to or between operations 102, 104, and 106.

Figure 3:
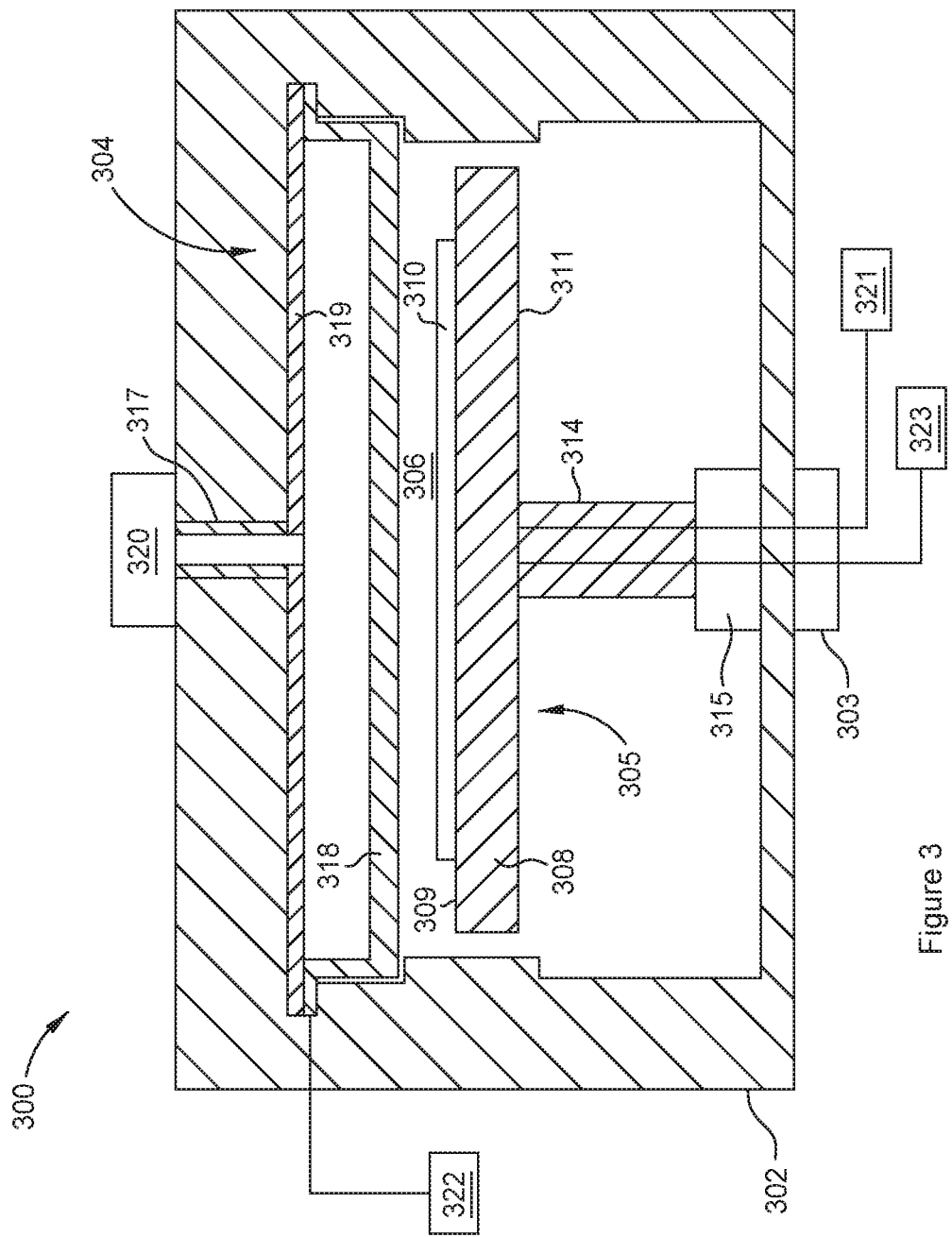
FIG. 3 is a schematic cross-section view of a processing chamber according to an embodiment.

FIG. 3 is a schematic cross-sectional view of a plasma processing chamber 300, according to one embodiment. Exemplary processing chambers are available from Applied Materials, Inc. located in Santa Clara, Calif. It is to be understood that the chamber described below is an exemplary chamber and other chambers, including chambers from other manufacturers, may be used with or modified to accomplish aspects of the present disclosure.

The plasma processing chamber 300 includes a chamber body 302, a substrate support assembly 305, and a gas distribution assembly 304 positioned opposite the substrate support assembly 305 and defining a process volume 306 therebetween. The gas distribution assembly is configured to distribute gases uniformly into the process volume 306 of the plasma processing chamber 300 to facilitate deposition of a film onto a substrate 310 positioned on the substrate support assembly 305. The gas distribution assembly 304 includes a gas inlet passage 317, which delivers gas from a gas flow controller 320 into a gas distribution manifold 318 suspended from a hanger plate 319. The gas distribution manifold 318 includes a plurality of holes or nozzles (not shown) through which gaseous mixtures are injected into the process volume 306 during processing. The gas distribution assembly 304 can be connected to an RF return 322 to allow RF energy applied to a substrate support 308 to generate an electric field within the process volume 306, which is used to generate the plasma for processing of the substrate 310. Power supply 323 may provide a DC energy source, while power supply 321 may provide an RF energy source to facilitate plasma generation and/or chucking of the substrate 310.

The substrate support assembly 305 includes the substrate support 308, a base 315, a stem 314 connecting the base 315 to the substrate support 108, and a drive system 303. The substrate support assembly 305 is disposed within the interior volume of the plasma processing chamber 300. The substrate support 308 has an upper surface 309 that supports the substrate 310 and a lower surface 311 for mounting the stem 314 to the substrate support 308. The substrate support 308 is movably disposed in the process volume 306 by the stem 314 that is coupled to the drive system 303 located external of the chamber body 302. The stem 314 and base 315 are connected to the drive system 303 and a bellows (not shown) to allow the substrate support 308 to be raised, lowered, and/or rotated.

During processing, process gases are provided to the plasma processing chamber 300 to deposit films in accordance with aspects described above.

The above-described methods, such as the pretreatment process and flowable silicon deposition, may be performed in a single chamber, such as a Producer® chamber available from Applied Materials, Inc. of Santa Clara, Calif., or the above-described processes may be performed in various chambers of a cluster tool comprising multiple chambers which perform various functions, such as the Centura® available from Applied Materials, Inc. of Santa Clara, Calif.

Examples of the present disclosure provide methods for gapfilling semiconductor device features, such as high aspect ratio trenches, with a-Si film that involves pretreating the surface of the substrate to modify the underlying Si—OH or Si—H surface to Si—ON or Si—N. The modification of the underlying surface of the substrate results in improved gapfilling, and more specifically semiconductor devices having seam-free and void-free a-Si gapfill without microporosity issues. More generally, the examples described herein result in semiconductor devices having increased silicon density and increased uniformity, which ultimately improves device functionality.

While the foregoing is directed to examples of the present disclosure, other and further examples of the disclosure may be devised without departing from the basic scope thereof, and the scope thereof is determined by the claims that follow.

What is claimed:

1. A semiconductor device, comprising:
   a substrate having at least one feature formed in a surface of the substrate, wherein the at least one feature is defined by sidewalls and a bottom surface;
   an oxynitride-terminated silicon layer disposed over the surface of the substrate and the sidewalls and the bottom surface of the at least one feature; and
   a flowable silicon film disposed over the oxynitride-terminated silicon layer, wherein the flowable silicon film fills the at least one feature and comprises amorphous silicon.

2. The semiconductor device of claim 1, wherein the at least one feature has an aspect ratio of 5:1 or more.

3. The semiconductor device of claim 1, wherein the at least one feature has an aspect ratio of greater than or equal to 10:1.

4. The semiconductor device of claim 1, wherein the oxynitride-terminated silicon layer is disposed on and in contact with the surface of the substrate and the sidewalls and the bottom surface of the at least one feature.

5. The semiconductor device of claim 4, wherein the flowable silicon film is disposed on and in contact with the oxynitride-terminated silicon layer and fills the at least one feature.

6. The semiconductor device of claim 5, wherein the flowable silicon film filling the at least one feature is seam-free.

7. The semiconductor device of claim 1, wherein the flowable silicon film has a Hydrogen concentration of greater than about 30%.

8. A semiconductor device, comprising:
a substrate having at least one feature formed in a surface of the substrate, wherein the at least one feature is defined by sidewalls and a bottom surface;
a nitride-terminated-silicon layer disposed over the surface of the substrate and the sidewalls and the bottom surface of the at least one feature; and
a flowable silicon film disposed over the nitride-terminated-silicon layer, wherein the flowable silicon film fills the at least one feature and comprises amorphous silicon.

9. The semiconductor device of claim 8, wherein the at least one feature has an aspect ratio of 5:1 or more.

10. The semiconductor device of claim 8, wherein the at least one feature has an aspect ratio of greater than or equal to 10:1.

11. The semiconductor device of claim 8, wherein the nitride-terminated-silicon layer is disposed on and in contact with the surface of the substrate and the sidewalls and the bottom surface of the at least one feature.

12. The semiconductor device of claim 11, wherein the flowable silicon film is disposed on and in contact with the nitride-terminated-silicon layer and fills the at least one feature.

13. The semiconductor device of claim 12, wherein the flowable silicon film filling the at least one feature is seam-free.

14. The semiconductor device of claim 8, wherein the flowable silicon film has a Hydrogen concentration of greater than about 30%.

15. A semiconductor device, comprising:
a substrate having at least one feature formed in a surface of the substrate, wherein the at least one feature is defined by sidewalls and a bottom surface;
a silicon pretreated surface layer disposed over the surface of the substrate and the sidewalls and the bottom surface of the at least one feature; and
a flowable silicon film disposed over the silicon pretreated surface layer, wherein the flowable silicon film fills the at least one feature and comprises amorphous silicon.

16. The semiconductor device of claim 15, wherein the silicon pretreated surface layer is an oxynitride-terminated silicon layer or a nitride-terminated-silicon layer.

17. The semiconductor device of claim 15, wherein the at least one feature has an aspect ratio of greater than or equal to 10:1.

18. The semiconductor device of claim 15, wherein
the silicon pretreated surface layer is disposed on and in contact with the surface of the substrate and the sidewalls and the bottom surface of the at least one feature, and
the flowable silicon film is disposed on and in contact with the silicon pretreated surface layer and fills the at least one feature.

19. The semiconductor device of claim 18, wherein the flowable silicon film filling the at least one feature is seam-free.

20. The semiconductor device of claim 15, wherein the flowable silicon film has a Hydrogen concentration of greater than about 30%.

* * * * *